(12) United States Patent
Matsunaga et al.

(10) Patent No.: US 11,227,740 B2
(45) Date of Patent: Jan. 18, 2022

(54) ELECTRON GUN AND ELECTRON BEAM APPLICATION DEVICE

(71) Applicant: HITACHI HIGH-TECH CORPORATION, Tokyo (JP)

(72) Inventors: Soichiro Matsunaga, Tokyo (JP); Yasunari Sohda, Tokyo (JP); Souichi Katagiri, Tokyo (JP); Makoto Sakakibara, Tokyo (JP); Hajime Kawano, Tokyo (JP); Takashi Doi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/644,871

(22) PCT Filed: Sep. 7, 2017

(86) PCT No.: PCT/JP2017/032276
§ 371 (c)(1),
(2) Date: Mar. 5, 2020

(87) PCT Pub. No.: WO2019/049261
PCT Pub. Date: Mar. 14, 2019

(65) Prior Publication Data
US 2020/0266020 A1    Aug. 20, 2020

(51) Int. Cl.
*H01J 37/063* (2006.01)
*H01J 37/141* (2006.01)
(Continued)

(52) U.S. Cl.
CPC .......... *H01J 37/063* (2013.01); *H01J 37/141* (2013.01); *H01J 37/244* (2013.01); *H01J 37/248* (2013.01); *H01J 37/28* (2013.01); *H01J 37/295* (2013.01)

(58) Field of Classification Search
CPC ...... H01J 37/063; H01J 37/141; H01J 37/244; H01J 37/248; H01J 37/28; H01J 37/295; H01J 2237/06375; H01J 37/07
See application file for complete search history.

(56) References Cited

U.S. PATENT DOCUMENTS 5,254,856 A * 10/1993 Matsui .................... H01J 37/12
250/441.11
5,895,919 A    4/1999 Frosien et al.
(Continued)

FOREIGN PATENT DOCUMENTS

| JP | S60127645 A | 7/1985 |
| JP | H10188868 A | 7/1998 |

(Continued)

OTHER PUBLICATIONS

L. Reimer, Scanning electron microscopy physics of image formation and microanalysis 2nd edition, Springer, (1998), pp. 21-34.
(Continued)

*Primary Examiner* — David A Vanore
(74) *Attorney, Agent, or Firm* — Miles & Stockbridge, P.C.

(57) ABSTRACT

In order to provide an electron gun capable of maintaining a small spot diameter of a beam converged on a sample even when a probe current applied to the sample is increased, a magnetic field generation source 301 is provided with respect to an electron gun including: an electron source 101; an extraction electrode 102 configured to extract electrons from the electron source 101; an acceleration electrode 103 configured to accelerate the electrons extracted from the electron source 101; and a first coil 104 and a first magnetic path 201 having an opening on an electron source side, the first coil 104 and the first magnetic path 201 forming a control lens configured to converge an electron beam emitted from the acceleration electrode 103. The magnetic field
(Continued)

generation source is provided for canceling a magnetic field, at an installation position of the electron source 101, generated by the first coil 104 and the first magnetic path 201.

9 Claims, 10 Drawing Sheets

(51) Int. Cl.
*H01J 37/244* (2006.01)
*H01J 37/28* (2006.01)
*H01J 37/248* (2006.01)
*H01J 37/295* (2006.01)

(56) References Cited

U.S. PATENT DOCUMENTS

| | | | | |
|---|---|---|---|---|
| 8,263,943 B2* | 9/2012 | Shichi | ............... | H01J 27/26 |
| | | | | 250/423 R |
| 9,640,360 B2* | 5/2017 | Shichi | ............... | H01J 27/022 |
| 10,319,558 B2* | 6/2019 | Sasaki | ............... | H01J 37/147 |
| 2009/0078869 A1* | 3/2009 | Matsumoto | ............ | H01J 37/26 |
| | | | | 250/311 |
| 2020/0266020 A1* | 8/2020 | Matsunaga | ............ | H01J 37/28 |

FOREIGN PATENT DOCUMENTS

| | | |
|---|---|---|
| JP | 2006324119 A | 11/2006 |
| JP | 2010272381 A | 12/2010 |

OTHER PUBLICATIONS

J. Orloff, Handbook of Charged Particle Optics, CRC Press, New York (1997), pp. 275-318.

International Search Report w/translation dated Dec. 12, 2017 issued in PCT/JP2017/032276.

* cited by examiner

[FIG. 1]
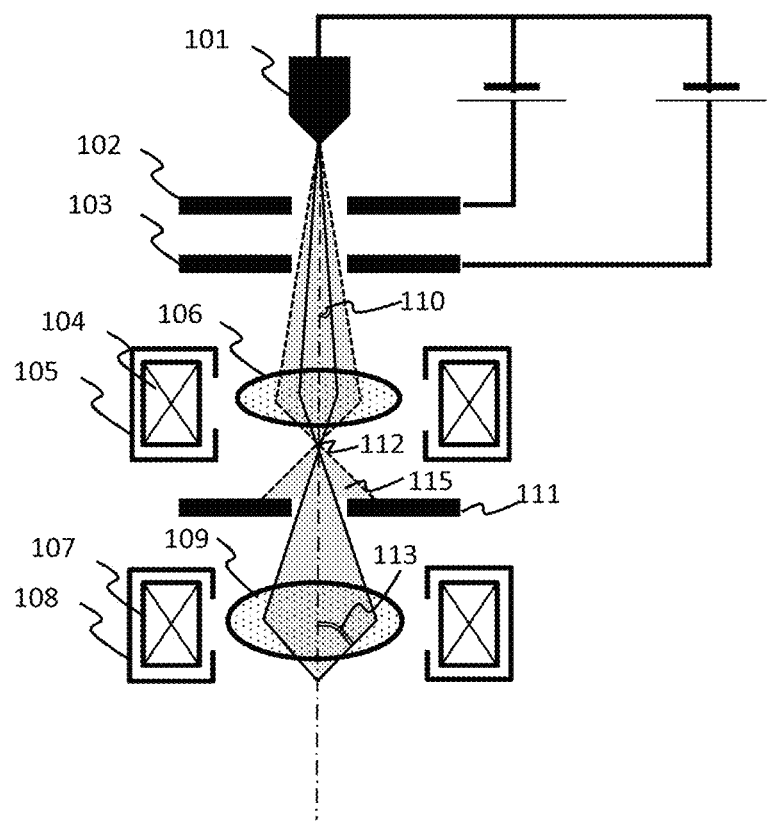

[FIG. 2A]
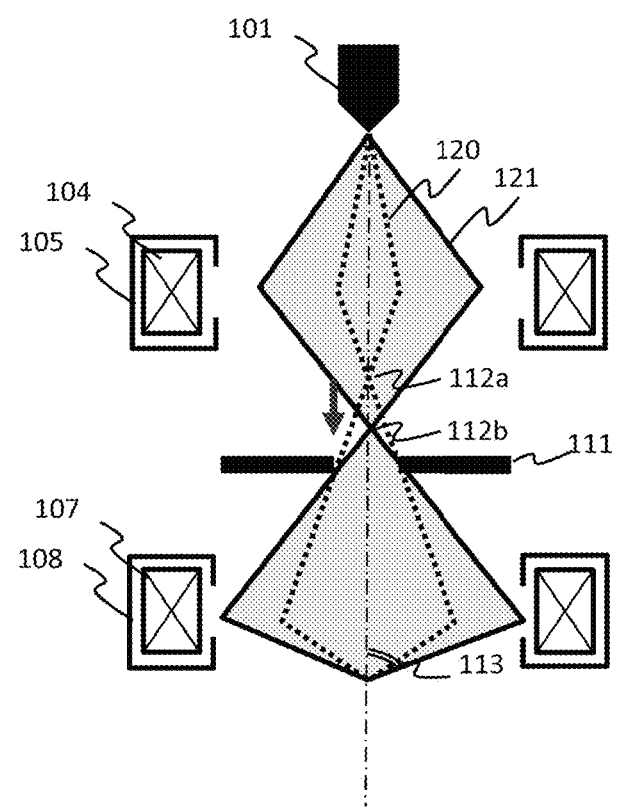

[FIG. 2B]
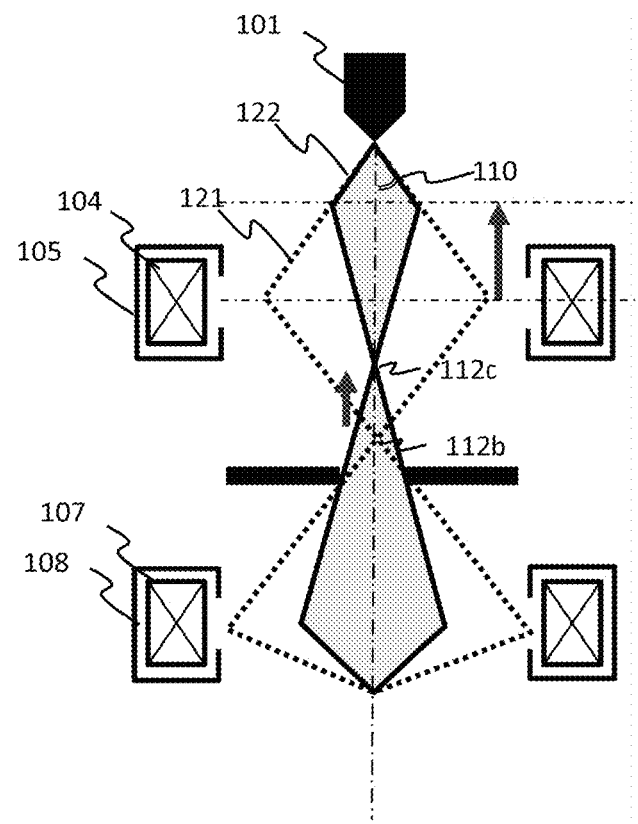

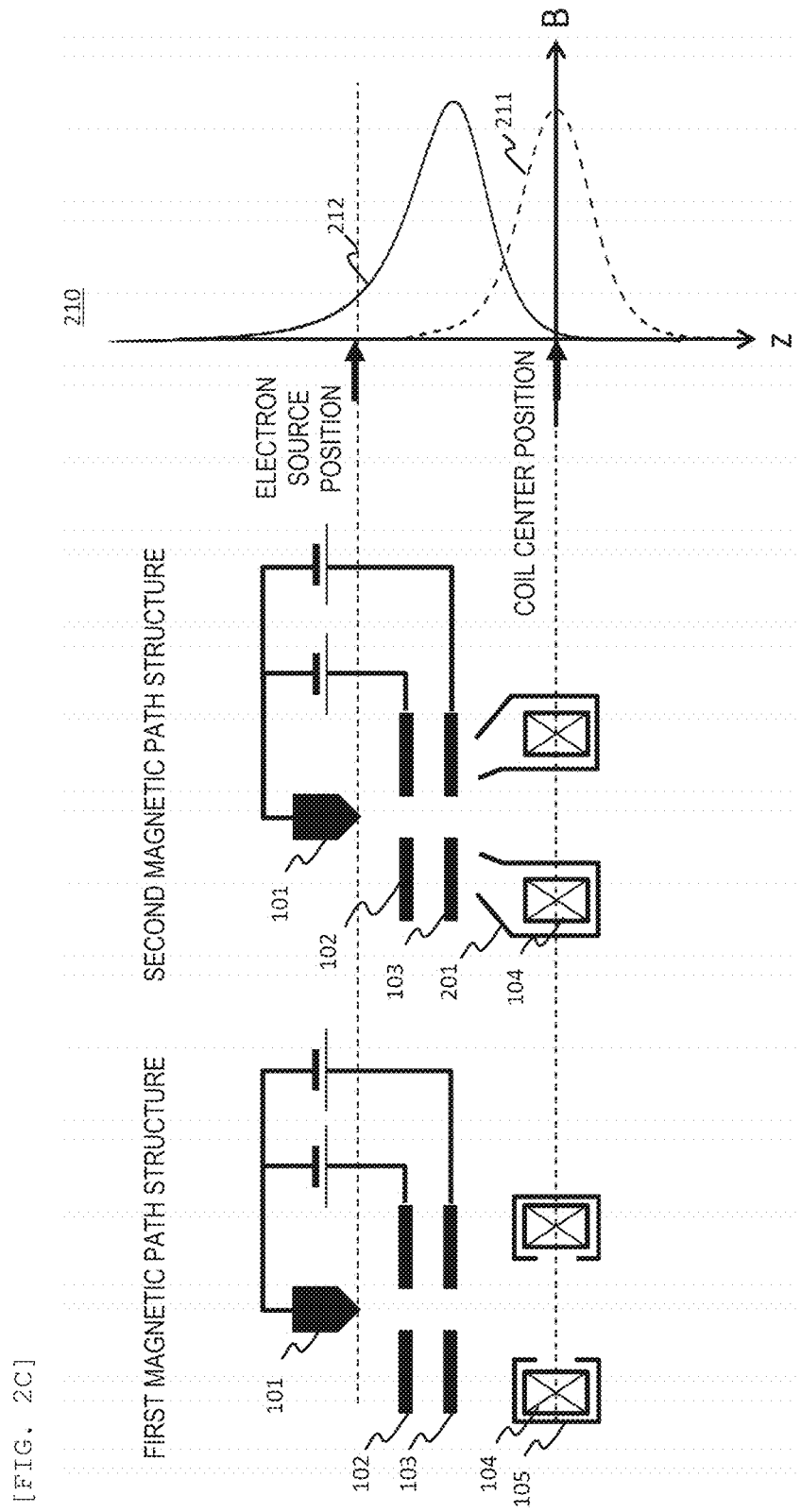

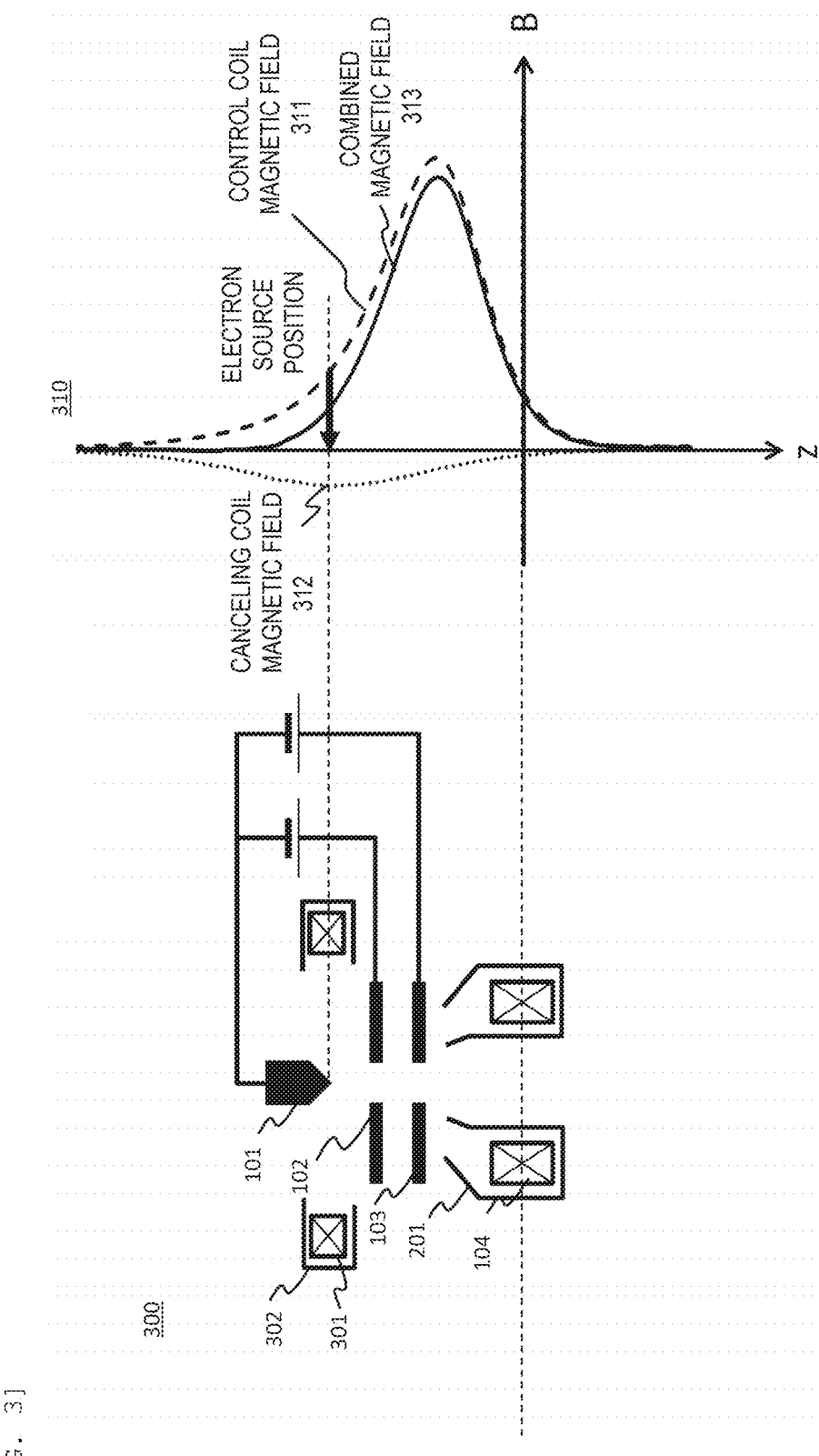
[FIG. 3]

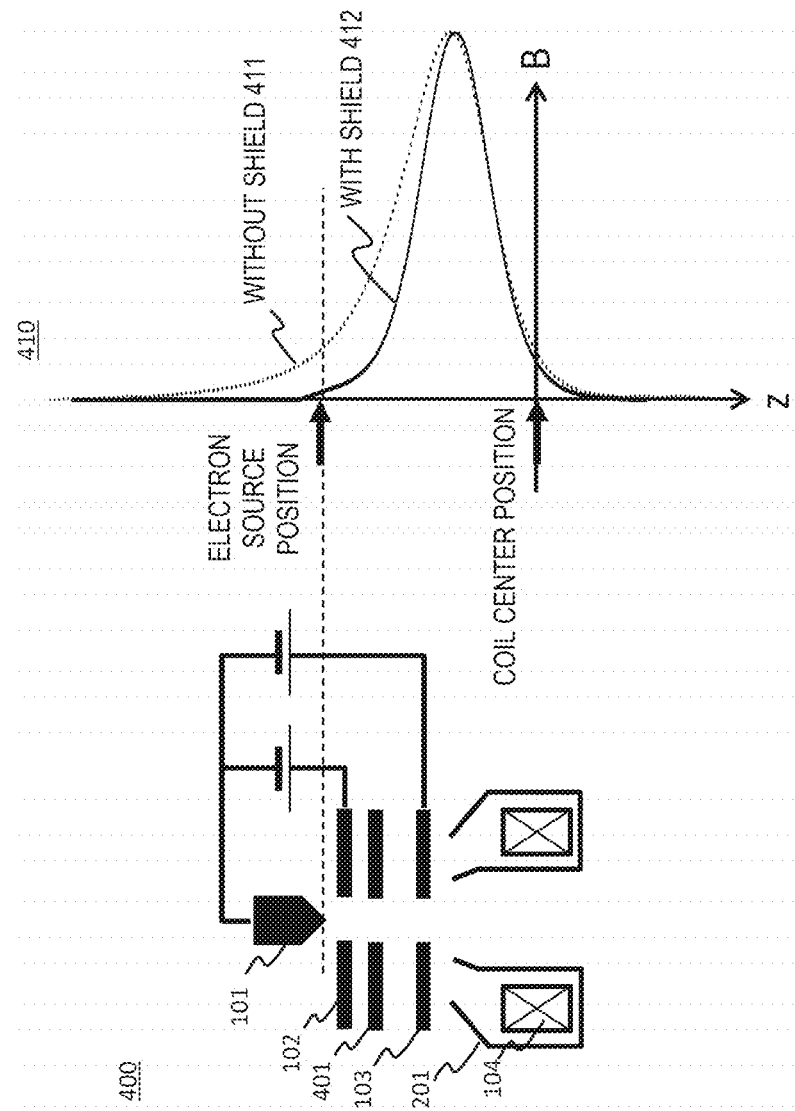

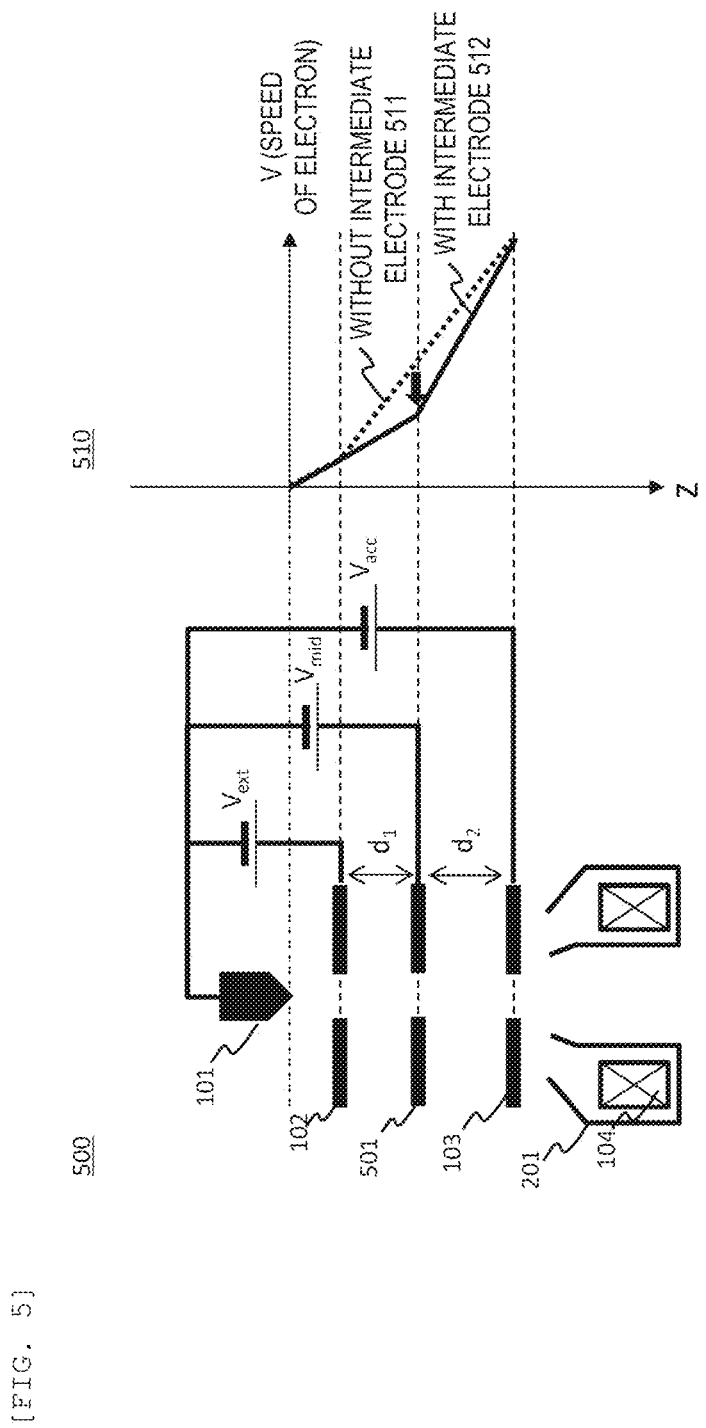

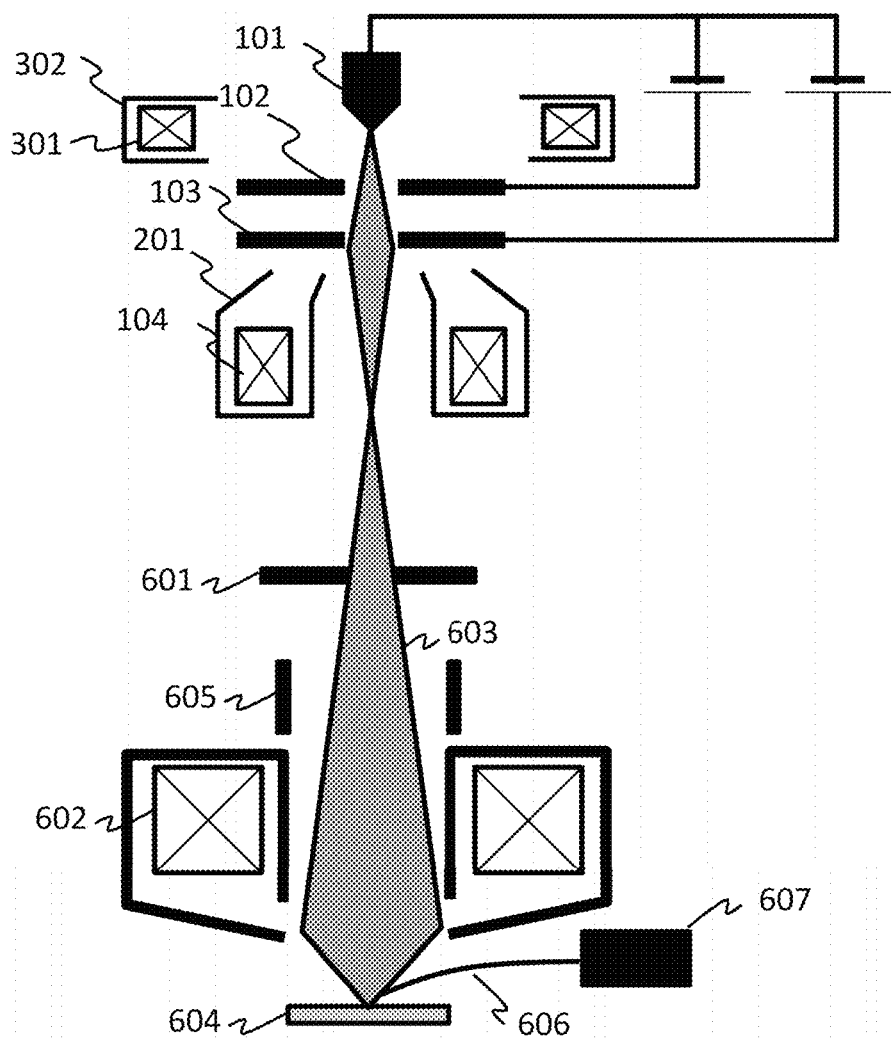
[FIG. 6]

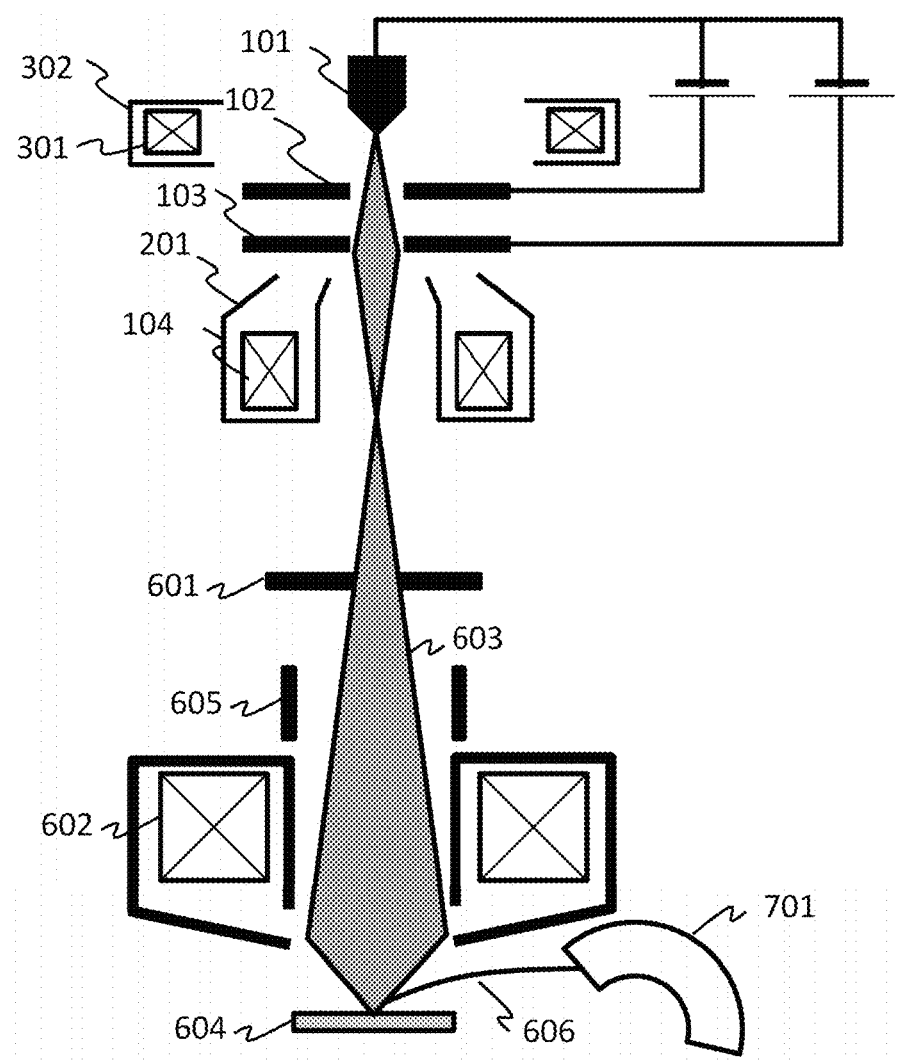
[FIG. 7]

[FIG. 8]
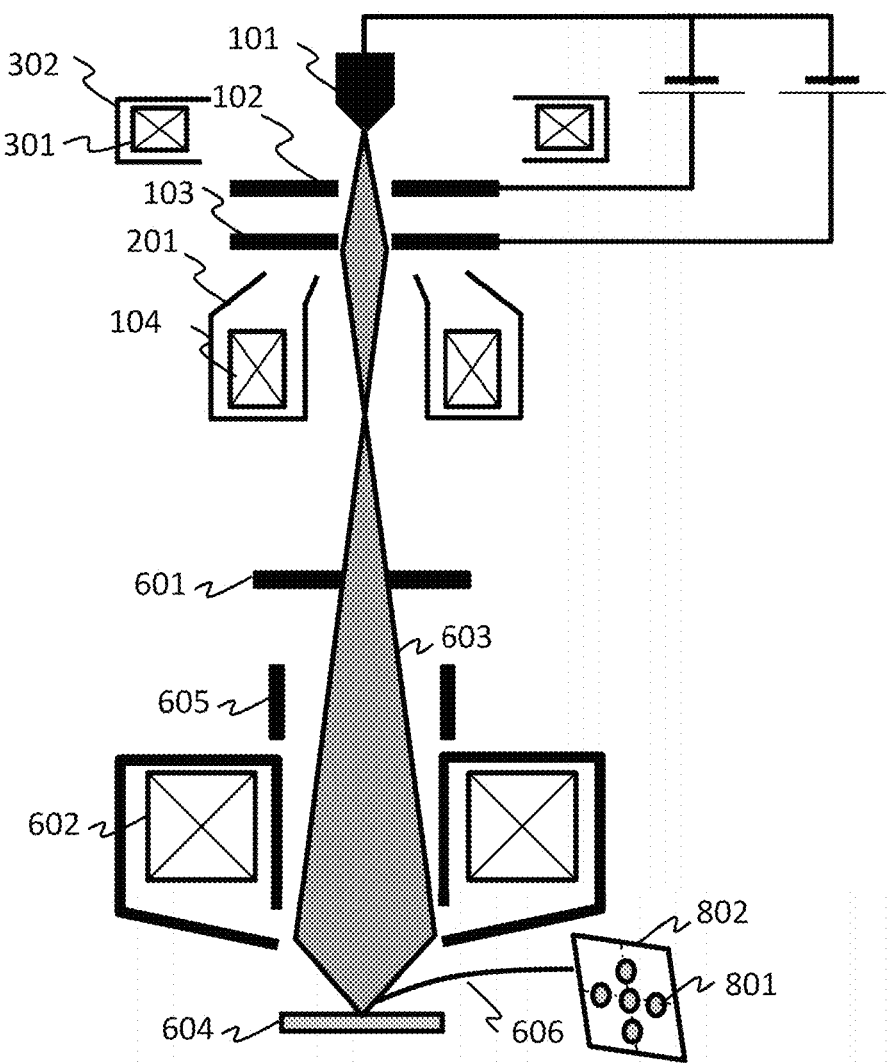

ELECTRON GUN AND ELECTRON BEAM APPLICATION DEVICE

TECHNICAL FIELD

The present invention relates to an electron gun used in an electron beam application device such as an electron microscope, or an electron beam application device including the electron gun.

BACKGROUND ART

A scanning electron microscope (SEM) is widely used for visualization of a fine structure. The SEM is used not only for an observation of a form of a material such as metal and an observation of a fine shape and form of a biological sample, but also for a dimensional inspection and defect inspection and the like of a semiconductor fine pattern. The SEM scans a measurement sample while irradiating the measurement sample with an electron beam, and detects signal electrons (secondary electrons and/or reflected electrons) emitted from the measurement sample to obtain a scanning image (SEM image).

Image quality of the SEM image is mainly determined by two points: image roughness and image sharpness. The SEM converges the electron beam emitted from an electron gun into a spot shape by a convergent lens, but the image roughness depends on a current amount of a convergent beam, and the image sharpness depends on a size of the spot converged on the sample (hereinafter referred to as a spot diameter).

The spot diameter depends on a size of a light source of the electron beam and an aberration generated by the convergent lens. Since the size of the light source is determined by an electron source, how to reduce the aberration of the convergent lens is a problem for an electron irradiation system. The aberration is a phenomenon in which an electron beam does not completely converge at a convergence point of the convergent lens. A general electron irradiation system of the SEM is shown in FIG. 1. Electrons are extracted from an electron source 101 by an extraction electrode 102 and the electrons are accelerated to a desired speed by an acceleration electrode 103, whereby an electron beam is emitted. The electron beam converges on a sample by a control magnetic field lens 106 formed by a control coil 104 and a magnetic path 105, and an objective magnetic field lens 109 formed by an objective coil 107 and a magnetic path 108. In addition, an aperture 111 is disposed between the control lens 106 and the objective lens 109. A part 115 of the electron beam diverging from a convergence point 112 cannot pass through the aperture 111, and the electron beam emitted toward the sample is limited to a beam capture angle 110.

In such an SEM electron irradiation system, when the electron beam converges, an aberration occurs both in the control lens 106 and the objective lens 109. As described in Non-PTL 1, the aberration of the objective lens 109 increases as a convergence angle 113 of the objective lens 109 increases. On the other hand, when the convergence angle 113 of the objective lens 109 is large, a magnification of the objective lens 109 is small, and when the convergence angle 113 of the objective lens 109 is small, the magnification of the objective lens 109 is large. Accordingly, the aberration generated by the control lens 106 at a previous stage is projected larger as the convergence angle 113 of the objective lens 109 reduces. As a result, in the electron irradiation system as shown in FIG. 1, based on the aberration of each of the control lens 106 and the objective lens 109 and the magnification of the objective lens 109, there is a convergence angle at which an effect of the aberration is minimized, that is, an optimal convergence angle that gives a smallest spot diameter.

In the electron irradiation system of FIG. 1, to simplify an explanation, an example in which two magnetic field lenses are respectively used as the control lens and the objective lens is shown, but it is common to use two or more lenses or a combination of electrostatic lenses. In addition, the convergence point 112 is formed by the control lens 106 in the electron beam of FIG. 1, but there are also irradiation systems without convergence point 112.

In order to improve the image quality of the SEM image, the current amount may be increased under a condition in which the smallest spot diameter is provided in the electron irradiation system. One way to increase the current amount is to increase the beam capture angle 110. By increasing the beam capture angle 110, more electrons pass through the aperture 111, so that the current amount increases. For this purpose, the beam capture angle 110 can be increased by the control lens 106 controlling a position of the convergence point 112 in a direction of the aperture 111. FIG. 2A shows a convergence path of the electron beam controlled in this way. When the convergence point is a convergence point 112a, the electron beam converges on the sample along a path 120 (dotted line). On the other hand, when the convergence point is a convergence point 112b, the electron beam converges on the sample along a path 121 (solid line). Accordingly, when the convergence point 112a is moved to the convergence point 112b, the beam capture angle can increase, whereas at the same time, the convergence angle 113 also increases, and the aberration generated at the objective lens 109 increases. This means that when the current amount is increased in order to control the image roughness, the spot diameter increases and the image sharpness is deteriorated.

In order to solve this problem, a method of bringing the control lens 106 closer to the electron source 101 is known. This method will be described with reference to FIG. 2B. As described in FIG. 2A, when the convergence point is the convergence point 112b, the electron beam converges on the sample along the path 121 (dotted line). Meanwhile, when the control lens 106 is brought closer to the electron source 101, the convergence point can be moved to a convergence point 112c which is closer to an electron source side while maintaining the beam capture angle 110 which was expanded, and the convergence angle 113 can be reduced. The electron beam at this time is shown as a path 122 (solid line).

PTLs 1 to 3 disclose respectively an electron gun configured by integrating the magnetic field lenses. In addition, PTL 4 discloses a particle beam device configured such that a magnetic field of a condenser lens is superimposed on a cathode, an extraction electrode, and an anode that constitutes a thermal field emission electrode.

CITATION LIST

Patent Literature

PTL 1: JP-A-60-127645
PTL 2: JP-A-2006-324119
PTL 3: JP-A-2010-272381
PTL 4: JP-A-10-188868

Non-Patent Literature

Non-PTL 1: L. Reimer, Scanning electron microscopy physics of image formation and microanalysis 2nd edition, Springer, (1998), p. 21-34

Non-PTL 2: J. Orloff, Handbook of Charged Particle Optics, CRC Press, New York (1997), p. 275-318

SUMMARY OF INVENTION

Technical Problem

PTL 3 discloses a configuration in which the electron source is immersed in a magnetic field generated by an electromagnetic lens, and PTLs 1 and 2 disclose a configuration in which the magnetic field lens is generated at an intermediate stage between the extraction electrode and the acceleration electrode. As the configuration of PTL 3 or a configuration of PTL 2 in which a coil of the magnetic field lens is disposed between the extraction electrode and the acceleration electrode, when the electron source and a magnetic field generation source are disposed close to each other, the magnetic field generation source needs to be removed when the electron gun is started in vacuum. In order to make the electron gun in an ultra-high vacuum state, it is necessary to heat and bake the gun to a temperature up to 200° C., whereas, since an electromagnetic coil is heat sensitive, it is necessary to remove the coil every time the electron gun is baked. Since an installation situation is changed every time the coil is removed, it is not suitable for a stable operation of the electron gun.

Meanwhile, PTL 1 and PTL 2 disclose a configuration in which the electromagnetic coil is disposed at a position away from the electron source by setting the electrode fixed in the electron gun to a magnetic body and also using the electrode as a magnetic path of the lens. However, in this case, since the electrode also serves as the magnetic path, an axis of each of lenses generated by an electric field and a magnetic field cannot be individually adjusted. An axial deviation may cause a deviation of the convergence point, that is, an increase in the spot diameter, which may lead to a risk of deterioration of the image sharpness.

In order to prevent such an axial deviation, it is preferable to independently adjust the electric field and the magnetic field. PTL 4 discloses a structure example in which a magnetic path that guides a magnetic field and an electrode are formed in different structures, and further the magnetic path that guides the magnetic field is directed to an electron source side. However, such a structure also has a risk of causing the deterioration of the image sharpness. A problem to be solved by the invention will be described with reference to FIG. 2C.

In a first magnetic path structure, as in the electron irradiation system shown in FIG. 1, a magnetic path 105 that generates a control electromagnetic lens is opened toward an optical axis of the electron beam. Meanwhile, in a second magnetic path structure, a magnetic path 201 that generates the control electromagnetic lens is opened toward the electron source 101. The magnetic path 201 is opened toward the optical axis together with the electron source 101 (that is, obliquely upward), but is not limited to this shape. An axial magnetic field distribution 210 shows axial magnetic field calculation results for respective magnetic path structures. The magnetic field distribution of the first magnetic path structure is a broken line 211, and the magnetic field distribution of the second magnetic path structure is a solid line 212. A peak of the magnetic field can be moved to an electron source side by changing the shape of the magnetic path even if positions of the coils are the same.

Here, as shown in the axial magnetic field distribution 210, it can be seen that the magnetic field at a position of the electron source is substantially zero in the first magnetic path structure, but the magnetic field has spread to the position of the electron source in the second magnetic path structure. Accordingly, a new problem is raised because the electron source is immersed in the magnetic field generated by the electromagnetic lens. When the electron source is immersed in the magnetic field, electrons are affected by the magnetic field from a low-speed state just after the electrons are extracted from the electron source, so that a stay time in a state where an electron density near the electron source is high will increase, and an effect of an electrostatic repulsion between the electrons will increase. As described in Non-PTL 2, a phenomenon is generated in which an energy variation of the electrons increases when affected by the electrostatic repulsion between electrons for a long time, the electron beam is less likely to converge at one point (called chromatic aberration), and the light source increases. Such an increase in chromatic aberration and an increase in the light source may cause deterioration of the image sharpness.

Solution to Problem

An electron gun as an embodiment for solving the above problems includes: an electron source; an extraction electrode configured to extract electrons from the electron source; an acceleration electrode configured to accelerate the electrons extracted from the electron source; a first coil and a first magnetic path having an opening on an electron source side, the first coil and the first magnetic path forming a control lens configured to converge an electron beam emitted from the acceleration electrode; and a magnetic field generation source configured to cancel a magnetic field, at an installation position of the electron source, generated by the first coil and the first magnetic path. Another embodiment is an electron beam application device having such an electron gun.

Other problems and novel features will become apparent from a description of the present specification and drawings.

Advantageous Effect

Even when a probe current applied to a sample is increased, a spot diameter of the beam converged on the sample can be maintained small. As a result, an SEM image with little roughness and high sharpness can be obtained. In addition, the increase of the probe current can also increases a speed of imaging.

BRIEF DESCRIPTION OF DRAWINGS

FIG. 1 is a schematic diagram of an electron irradiation system of an electron microscope.

FIG. 2A is a diagram showing a change of an electron beam path when a convergence point of a control lens is moved to an aperture side;

FIG. 2B is a diagram showing a change of the electron beam path when the convergence point of the control lens is moved to the aperture side by moving the control lens to an electron source side;

FIG. 2C is a diagram showing a problem of the invention.

FIG. 3 shows a schematic diagram of an electron gun according to a first embodiment and an axial magnetic field distribution thereof.

FIG. 4 shows a schematic diagram of an electron gun according to a second embodiment and an axial magnetic field distribution thereof.

FIG. 5 shows a schematic diagram of an electron gun according to a third embodiment and an axial potential distribution thereof.

FIG. 6 is a diagram showing a configuration of a scanning electron microscope.

FIG. 7 is a diagram showing a configuration of an electronic energy measuring device.

FIG. 8 is a diagram showing a configuration of an electron diffraction pattern measuring device.

DESCRIPTION OF EMBODIMENTS

First Embodiment

FIG. 3 shows a schematic diagram of an electron gun 300 according to a first embodiment and an axial magnetic field distribution 310 thereof. The electron gun 300 includes an electron source 101, an extraction electrode 102, an acceleration electrode 103, a coil 104 and a magnetic path 201 that form a control lens, and a magnetic field canceling coil 301 and a magnetic path 302.

First, since the coil 104 used in the control lens is disposed below the acceleration electrode 103, it is not necessary to remove the coil 104 when the electron gun is baked, and a vacuum start of the electron gun is easier than that in a coil detachable electron gun. In addition, since a physical position of the coil 104 and the magnetic path 105 can be adjusted independently of the extraction electrode 102 and the acceleration electrode 103 that generate an electric field, an axis of a lens generated by the electric field and an axis of a lens generated by the magnetic field can be adjusted independently, so that an effect on deterioration of image sharpness due to an axial deviation can be reduced.

Similarly to the second magnetic path structure of FIG. 2C, in order to acquire a large current, in the electron gun 300, an opening of the magnetic path 201 is directed toward an electron source side, so that a peak of the magnetic field is formed at an electron source side. For this reason, the electron source is immersed in the magnetic field as described above. Here, in the electron gun 300, the canceling coil 301 that generates a magnetic field opposite to that of the coil 104 is disposed upstream (at the electron source side) of the coil 104. Since the magnetic field generated by the canceling coil 301 can cancel a tail of the magnetic field generated by the coil 104, the magnetic field generated by the canceling coil 301 may spread more spatially than the magnetic field generated by the coil 104. Accordingly, the magnetic path 302 that guides the magnetic field generated by the canceling coil 301 does not need to be near the axis, and a diameter of the canceling coil 301 can be set larger than a diameter of the coil 104. Accordingly, the canceling coil can be disposed at a position where it is not necessary to remove the canceling coil when the electron gun is baked. For example, the canceling coil 301 and the magnetic path 302 do not need to be disposed in a vacuum column, and can be disposed outside the vacuum column.

In the axial magnetic field distribution 310, calculation results of a control coil magnetic field 311 (broken line) generated by the coil 104 and the magnetic path 105 and a canceling coil magnetic field 312 (dotted line) generated by the canceling coil 301 and the magnetic path 302 are shown. The solid line is a combined magnetic field 313 obtained by combining these magnetic fields. The magnetic field 311 generated by the control coil and the magnetic field 312 generated by the canceling coil are combined, thus the magnetic field near the electron source generated by the control coil 104 can be canceled by the magnetic field generated by the canceling coil 301 and the magnetic field near the electron source can be reduced. Accordingly, the deterioration of the image sharpness due to an increase in the electrostatic repulsion can be prevented, and the deterioration of the image sharpness when a large current is acquired can be prevented by up to 20%.

In the example of FIG. 3, the canceling coil 301 is disposed at an electron source position, but the canceling coil 301 may be shifted in a vertical (optical axis) direction. In that case, it is desirable to adjust an opening direction of the magnetic path 302 such that the peak position of the magnetic field generated by the canceling coil 301 comes to the electron source position. In addition, in order not to generate an unnecessary magnetic field, it is desirable to set the magnetic field generated by the canceling coil 301 to a minimum value for canceling the tail of the magnetic field generated by the coil 104. Here, a magnetic field generated by a winding coil is proportional to a product of the number of coil turns and a current flowing through the coil, and inversely proportional to a diameter of the coil. Accordingly, further, a product of the number of turns of the canceling coil 301 and a current flowing through the coil is set smaller than a product of the number of turns of the coil 104 and a current flowing through the coil to reduce the magnetic field generated by the canceling coil 301.

In the example of FIG. 3, a coil is used to generate a magnetic field for canceling, but a permanent magnet can also be used as a magnetic field generation source that generates a magnetic field opposite to that of the control coil 104. However, using of the canceling coil 301 has an advantage that the magnetic field to be generated with a magnitude in accordance with a magnitude of the magnetic field of the control coil 104 can be generated with high accuracy.

Second Embodiment

FIG. 4 shows a schematic diagram of an electron gun 400 according to a second embodiment and an axial magnetic field distribution 410 thereof. A magnetic shield made of a magnetic body is disposed downstream of the extraction electrode 102 to prevent the electron source from being immersed in the magnetic field. A magnetic shield 401 is a magnetic disk having an opening for allowing the electron beam to pass through in the center. In the axial magnetic field distribution 410, calculation results of an axial magnetic field 411 when the magnetic shield 401 is not disposed and an axial magnetic field 412 when the magnetic shield 401 is disposed are shown. By disposing the magnetic shield 401, the magnetic field near the electron source can be reduced.

In order to further simplify a structure, the extraction electrode 102 can be made of a magnetic body and used as the magnetic shield instead of disposing a new magnetic shield. Such a structure can also prevent the electron source from being immersed in the magnetic field.

Third Embodiment

FIG. 5 shows a schematic diagram of an electron gun 500 according to a third embodiment and an axial potential distribution 510 thereof. In the third embodiment, by utilizing an intermediate electrode, it is possible to effectively bring a control lens closer to an electron source. In a magnetic field lens, since a shape of the magnetic field is determined by a shape of a magnetic path and a magnitude of the magnetic field is determined by the number of turns of the coil and a current amount, it is necessary to change the shape of the magnetic path in order to change a shape of the lens. However, since a traveling direction of electrons is controlled by the magnetic field and the electric field, even when the shape and the magnitude of the magnetic field are the same, the effect is different if the speeds of the electrons are different. That is, even with the same magnetic field lens, the faster the speed of the electrons subjected to a convergence action is, the slower the convergence is, and the farther a distance from a convergence point to a lens main surface is. Conversely, the slower the speed of the electrons subjected to the convergence action is, the faster the convergence is, and the closer the distance from the convergence point to the lens main surface is.

Accordingly, in the electron gun 500, in order to accelerate the convergence of the electrons and bring the main surface of the control lens closer to the electron source, an intermediate electrode 501 is disposed between the extraction electrode 102 and the acceleration electrode 103, a potential of the intermediate electrode 501 is to be controlled. Voltage conditions necessary for the control will be described below. In the axial potential distribution 510, a potential distribution (schematic diagram) 511 when there is no intermediate electrode is shown by a dotted line. Since a space between the extraction electrode 102 and the acceleration electrode 103 is a vacuum, a potential gradient is substantially constant. Here, the intermediate electrode 501 is disposed, and a potential thereof is determined by Equation 1.

$$V_{mid} < \frac{V_{ext}d_2 + V_{acc}d_1}{d_1 + d_2} \quad [\text{Equation 1}]$$

A voltage $V_{ext}$ is a voltage applied to the extraction electrode 102, a voltage $V_{acc}$ is a voltage applied to the acceleration electrode 103, a voltage $V_{mid}$ is a voltage applied to the intermediate electrode 501, and each of the voltages is expressed as a potential with reference to the electron source. A distance $d_1$ is a distance between the extraction electrode 102 and the intermediate electrode 501, and a distance $d_2$ is a distance between the intermediate electrode 501 and the acceleration electrode 103. By controlling the potential as shown in Equation 1, the potential gradient changes along a solid line 512 of the axial potential distribution 510, and in the space from the extraction electrode 102 to the acceleration electrode 103, the speed of the electrons closer to the extraction electrode 102 can be reduced. An orbit in which the electrons converge at an earlier stage can be obtained by controlling the potential of the intermediate electrode 501 in this way, that is, the effective main surface of the control lens can be brought closer to the electron source.

In order prevent the deterioration of the image sharpness, it is necessary to reduce the magnitude of the magnetic field near the electron source 101 generated by the coil 104 and the magnetic path 201. Therefore, it is effective to combine the intermediate electrode with the configuration of the first embodiment or the second embodiment. Further, as an example in a case of being combined with the second embodiment, the intermediate electrode 501 is made of a magnetic body, and thus the intermediate electrode also serves as a structure for shielding the electron source from the magnetic field generated by the control coil 104.

Fourth Embodiment

As a fourth embodiment, an electron beam application device including the electron gun described above will be described.

FIG. 6 shows a configuration example of a scanning electron microscope including the electron gun 300 described in the first embodiment. An electron beam emitted from the electron gun including the electron source 101, the extraction electrode 102, the acceleration electrode 103, the coil 104 and the magnetic path 201 that form the control lens, and the magnetic field canceling coil 301 and the magnetic path 302 is limited by an aperture 601, an electron beam 603 is converged on a sample 604 by an objective lens using a magnetic field generated by an objective coil 602. A scanning electron microscope image is obtained by detecting secondary electrons 606 emitted from the sample 604 using a detector 607 while scanning the sample with the converged beam using a deflector 605. In FIG. 6, the first embodiment is described using the electron gun of the first embodiment, but the electron gun of the second embodiment, the third embodiment, or a combination of the second embodiment and the third embodiment can be used similarly. Accordingly, it is possible to provide a scanning electron microscope by which an electron microscope image with low image roughness and high sharpness can be obtained.

FIG. 7 is a diagram showing a configuration of an electron energy measuring device. FIG. 7 also shows an example in which an electron gun 200 is mounted. A basic configuration for irradiating the sample 604 with an electron beam is the same as in FIG. 6, a beam emitted from the electron gun including the electron source 101, the extraction electrode 102, the acceleration electrode 103, the coil 104 and the magnetic path 201 that form the control lens, and the magnetic field canceling coil 301 and the magnetic path 302 is limited by the aperture 601, the electron beam 603 is converged on the sample 604 by an objective lens using a magnetic field generated by the objective coil 602. An energy distribution of the secondary electrons 606 emitted from the sample 604 is measured by an energy analyzer 701 while the sample is scanned with the converged beam using the deflector 605. According to such a configuration, the device can perform measurement as an auger spectrometer or an electron beam energy loss spectrometer.

FIG. 8 is a diagram showing a configuration of an electron beam diffraction pattern measuring device. FIG. 8 also shows an example in which the electron gun 200 is mounted. A basic configuration for irradiating the sample 604 with an electron beam is the same as in FIG. 6, the beam emitted from the electron gun including the electron source 101, the extraction electrode 102, the acceleration electrode 103, the coil 104 and the magnetic path 201 that form the control lens, and the magnetic field canceling coil 301 and the magnetic path 302 is limited by the aperture 601, the electron beam 603 is converged on the sample 604 by an objective lens using a magnetic field generated by the objective coil 602. The device can perform a measurement as an electron backscatter diffraction device by measuring an interference pattern 801 of the secondary electrons 606 emitted from the sample 604 using a detector 802 disposed two-dimensionally, while scanning the sample with the converged beam using the deflector 605.

In the configuration shown in FIGS. 7 and 8, an electron gun of the first embodiment, the second embodiment, the third embodiment, or a combination thereof can also be used. Accordingly, an electron beam application analysis which achieves both a high signal-to-noise ratio and a high spatial resolution is possible. In addition, an analysis which achieves both a high-speed measurement and the high spatial resolution is possible, and the analysis time can be reduced by about 20%.

REFERENCE SIGN LIST

101: electron source
102: extraction electrode
103: acceleration electrode
104: control coil
105: magnetic path
106: control lens
107: objective coil
108: magnetic path
109: objective lens
111: aperture
201: magnetic path
300, 400, 500: electron gun
301: magnetic field canceling coil
302: magnetic path
401: magnetic shield
501: intermediate electrode
601: aperture
602: objective coil
604: sample
605: deflector
606: secondary electron
607: detector
701: energy analyzer
802: detector disposed two-dimensionally

The invention claimed is:

1. An electron gun, comprising:
    an electron source;
    an extraction electrode configured to extract electrons from the electron source;
    an acceleration electrode configured to accelerate the electrons extracted from the electron source;
    a first coil and a first magnetic path having an opening on an electron source side, the first coil and the first magnetic path forming a control lens configured to converge an electron beam emitted from the acceleration electrode; and
    a magnetic field generation source configured to cancel a magnetic field, at an installation position of the electron source, generated by the first coil and the first magnetic path.

2. The electron gun according to claim 1, wherein
    the magnetic field generation source is disposed closer to the electron source than the first coil and the first magnetic path.

3. The electron gun according to claim 2, wherein
    the magnetic field generation source includes a second coil and a second magnetic path, and
    a diameter of the second coil is set larger than a diameter of the first coil.

4. The electron gun according to claim 3, wherein
    a product of the number of coil turns of the second coil and a current passing through the coil is smaller than a product of the number of coil turns of the first coil and a current passing through the coil.

5. The electron gun according to claim 2, wherein
    the magnetic field generation source is a permanent magnet.

6. The electron gun according to claim 1, further comprising:
    an intermediate electrode disposed between the extraction electrode and the acceleration electrode, wherein
    a voltage $V_{mid}$ applied to the intermediate electrode satisfies Equation 1

$$V_{mid} < \frac{V_{ext}d_2 + V_{acc}d_1}{d_1 + d_2},$$

wherein the electron source is used as a reference potential, $V_{ext}$ is a voltage applied to the extraction electrode, $V_{acc}$ is a voltage applied to the acceleration electrode, $d_1$ is a distance between the extraction electrode and the intermediate electrode and $d_2$ is a distance between the intermediate electrode and the acceleration electrode.

7. An electron beam application device, comprising:
    the electron gun according to claim 1;
    an aperture configured to limit an electron beam emitted from the electron gun;
    a deflector configured to scan a sample with the electron beam;
    an objective lens configured to converge the electron beam on the sample; and
    a detector configured to detect electrons generated from the sample irradiated with the electron beam.

8. An electron beam application device, comprising:
    the electron gun according to claim 1;
    an aperture configured to limit an electron beam emitted from the electron gun;
    a deflector configured to scan a sample with the electron beam;
    an objective lens configured to converge the electron beam on the sample; and
    an energy analyzer configured to measure an energy distribution of electrons generated from the sample irradiated with the electron beam.

9. An electron beam application device, comprising:
    the electron gun according to claim 1;
    an aperture configured to limit an electron beam emitted from the electron gun;
    a deflector configured to scan a sample with the electron beam;
    an objective lens configured to converge the electron beam on the sample; and
    a detector disposed two-dimensionally and configured to measure an interference pattern of electrons generated from the sample irradiated with the electron beam.

* * * * *